United States Patent
Kuo et al.

(10) Patent No.: US 6,812,507 B2
(45) Date of Patent: Nov. 2, 2004

(54) NON-VOLATILE MEMORY CAPABLE OF PREVENTING ANTENNA EFFECT AND FABRICATION THEREOF

(75) Inventors: Tung-Cheng Kuo, Yilan Hsien (TW); Chien-Hung Liu, Taipei (TW); Shyi-Shuh Pan, Kaohsiung (TW); Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/636,448

(22) Filed: Aug. 6, 2003

(65) Prior Publication Data
US 2004/0026732 A1 Feb. 12, 2004

Related U.S. Application Data

(62) Division of application No. 10/128,742, filed on Apr. 23, 2002, now Pat. No. 6,642,113.

(30) Foreign Application Priority Data
Apr. 12, 2002 (TW) ........................................ 91107421 A

(51) Int. Cl.⁷ ............................................ H01L 27/148
(52) U.S. Cl. ........................ 257/225; 257/298; 257/350
(58) Field of Search ................................. 257/225, 298, 257/350, 428, 429; 365/185.28; 438/4, 19

(56) References Cited

U.S. PATENT DOCUMENTS

| 5,497,345 | A | * | 3/1996 | Cappelletti | 365/185.28 |
| 6,372,525 | B1 | * | 4/2002 | Lin et al. | 438/14 |
| 6,432,726 | B2 | * | 8/2002 | Iranmanesh | 438/4 |
| 6,642,113 | B1 | * | 11/2003 | Huang et al. | 438/275 |
| 2003/0178652 | A1 | * | 9/2003 | Kuo et al. | 257/225 |

* cited by examiner

Primary Examiner—David Nelms
Assistant Examiner—Dao H. Nguyen
(74) Attorney, Agent, or Firm—J.C. Patents

(57) ABSTRACT

A non-volatile memory capable of preventing the antenna effect and the fabrication thereof are described. The non-volatile memory includes a word-line having a high resistance portion and a memory cell portion on a substrate and a charge trapping layer located between the word-line and the substrate. The high resistance portion is electrically connected with a grounding doped region in the substrate and the memory cell portion is electrically connected with a metal interconnect over the substrate.

6 Claims, 4 Drawing Sheets

NON-VOLATILE MEMORY CAPABLE OF PREVENTING ANTENNA EFFECT AND FABRICATION THEREOF

CROSS-REFERENCE TO RELATED APPLICATION

This application is a divisional application of, and claims the priority benefit of, U.S. application Ser. No. 10/128,742 filed on Apr. 23, 2002, now U.S. Pat. No. 6,642,113.

BACKGROUND OF THE INVENTION

1. Field of Invention

The present invention relates to a structure of a semiconductor device and the fabrication thereof. More particularly, the present invention relates to a structure of a non-volatile memory capable of preventing the antenna effect and the fabrication thereof.

2. Description of Related Art

In a method for fabricating a non-volatile memory, a charge trapping layer and a polysilicon gate are formed sequentially on a substrate and then a source/drain region is formed in the substrate beside the polysilicon gate. When the charge trapping layer is a silicon nitride-based layer, the non-volatile memory can be called a "nitride read-only memory (NROM)".

In a process of fabricating a non-volatile memory with a charge trapping layer, plasma techniques are frequently used. However, when a transient charge unbalance occurs in the plasma, charges will move along the conductive portions on the target wafer. Such an effect is called the "antenna effect". Consequently, some charges are injected into the charge trapping layers of the non-volatile memory to unevenly raise the threshold voltages ($V_T$) of the memory cells, i.e., to produce a programming effect. Therefore, the $V_T$ distribution of the non-volatile memory is much broadened, being usually from 0.3V to 0.9V.

In order to prevent the programming effect caused by the antenna effect, a diode is formed in the substrate to electrically connect with the word-line in the prior art. When the charges accumulated on the word-line reach a certain amount to produce a voltage higher than the breakdown voltage of the diode, the charges are released in a breakdown manner. However, the programming effect cannot be completely eliminated with this method since there may still be some charges injected into the charge trapping layer even if the voltage produced is lower than the breakdown voltage of the diode. Moreover, by using this method, the input voltage of the non-volatile memory is lowered by the diode to adversely decrease the operating speed of the memory device.

SUMMARY OF THE INVENTION

Accordingly, this invention provides a non-volatile memory and the fabrication thereof to prevent the charge trapping layer of a non-volatile memory from being damaged in a plasma process.

This invention also provides a non-volatile memory and the fabrication thereof to prevent the non-volatile memory from being programmed in a plasma process, so that the threshold voltages ($V_T$) of the memory cells are not raised and the $V_T$ distribution is not broadened.

This invention also provides a non-volatile memory and the fabrication thereof to avoid the input voltage of the memory device from being lowered, so that the operating speed is not decreased.

The non-volatile memory of this invention includes a word-line having a high resistance portion and a memory cell portion on a substrate and a charge trapping layer located between the word-line and the substrate. The high resistance portion of the word-line is electrically connected with a grounding doped region in the substrate and the memory cell portion is electrically connected with a metal interconnect over the substrate. The high resistance portion of the word-line is, for example, narrower than the other portions of the word-line in order to have a higher resistance.

This invention also provides a method for fabricating a non-volatile memory capable of preventing the antenna effect. In this method, a charge trapping layer is formed on a substrate and then a word-line having a high resistance portion and a memory cell portion is formed on the substrate. A grounding doped region is formed in the substrate and then the high resistance portion of the word-line is electrically connected with the grounding doped region. Thereafter, a metal interconnect is formed over the substrate to electrically connect with the memory cell portion of the word-line. When the process is completed, a large current is applied to blow the high resistance portion of the word-line.

This invention provides another method for fabricating a non-volatile memory capable of preventing the antenna effect. A charge trapping layer, a polysilicon layer and a metal silicide layer are formed sequentially on a substrate and then patterned to form a word-line having a memory cell portion and a high resistance portion. A grounding doped region is formed in the substrate and then a first contact is formed on the substrate to electrically connect the grounding doped region and the high resistance portion of the word-line. A second contact is formed over the substrate to electrically connect with the memory cell portion of the word-line. When the process is completed, a large current is applied to blow the high resistance portion of the word-line.

Because this invention uses a high resistance portion of the word-line to conduct the charges accumulated on the word-line into the substrate in a plasma process, the charge trapping layer of the non-volatile memory is not damaged and the memory cells are not programmed at random. Moreover, since the high resistance portion of the word-line has a high resistance, applying a large current can easily blow the high resistance portion to disconnect the word-line from the grounding doped region after the manufacturing process. Consequently, the input voltage of the memory device is not lowered and the operating speed of the memory device is not decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

Figure 1:
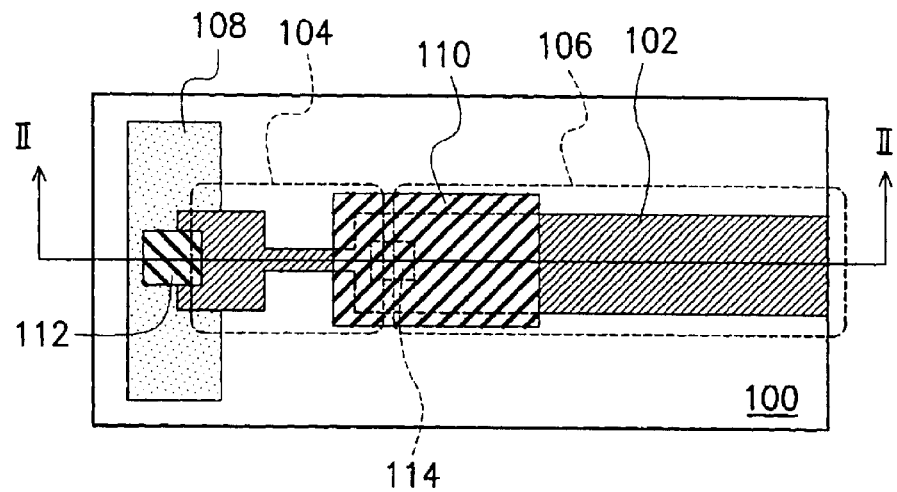
FIG. 1 illustrates a top view of a non-volatile memory structure capable of preventing the antenna effect according to a first embodiment of this invention.

Refer to FIG. 1, FIG. 1 illustrates a top view of a non-volatile memory structure capable of preventing the antenna effect according to the first embodiment of this invention.

As that shown in FIG. 1, a word-line 102 having a high resistance portion 104 and a memory cell portion 106 is located on a substrate 100. The high resistance portion 104 of the word-line 102 is narrower than the memory cell portion 106 in order to have a higher resistance and is electrically connected with a grounding doped region 108 formed in the substrate 100 via a contact 112. The memory cell portion 106 of the word-line 102 is electrically connected with a metal interconnect 110 via a contact 114.

Figure 2:
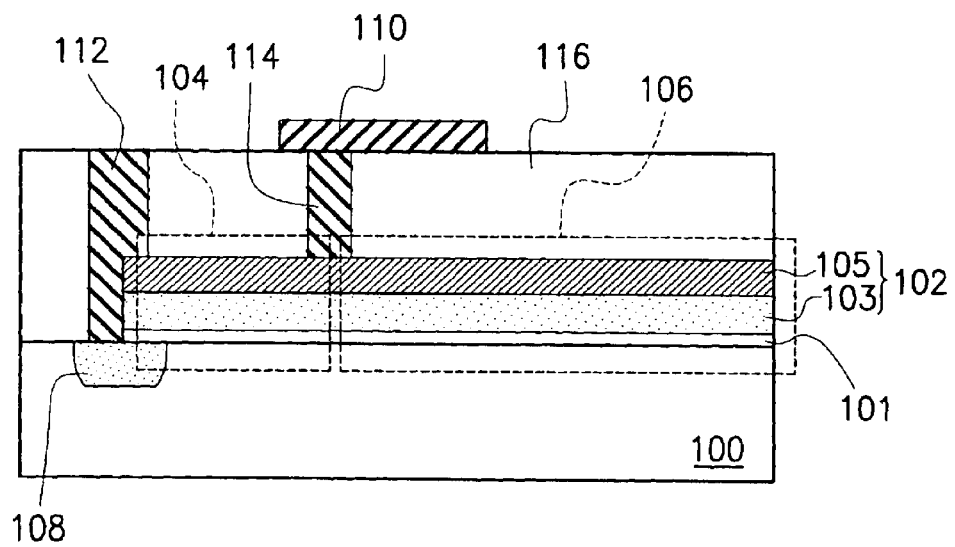
FIG. 2 illustrates a cross-sectional view of the non-volatile memory structure shown in FIG. 1 along the line II—II.

Refer to FIG. 2 to further understand the non-volatile memory structure according to the first embodiment of this invention. FIG. 2 illustrates a cross-sectional view of the non-volatile memory structure shown in FIG. 1 along the line II—II.

As that shown in FIG. 2, a word-line 102 comprising a polysilicon layer 103 and a metal silicide layer 105 is disposed on the substrate 100, wherein the metal silicide layer 105 comprises, for example, tungsten silicide ($WSi_x$). A charge trapping layer 101, which may comprise a silicon oxide/silicon nitride/silicon oxide (ONO) composite layer, is located between the word-line 102 and the substrate 100. When the charge trapping layer 101 is based on a silicon nitride layer, the non-volatile memory being fabricated can be called a "nitride read-only memory (NROM)". The two contacts 112 and 114 are located in a dielectric layer 116 that comprises a material such as borophosphosilicate glass (BPSG). When the process is completed, a large current is applied to blow the high resistance portion 104 of the word-line 102.

Second Embodiment

Figure 3A:
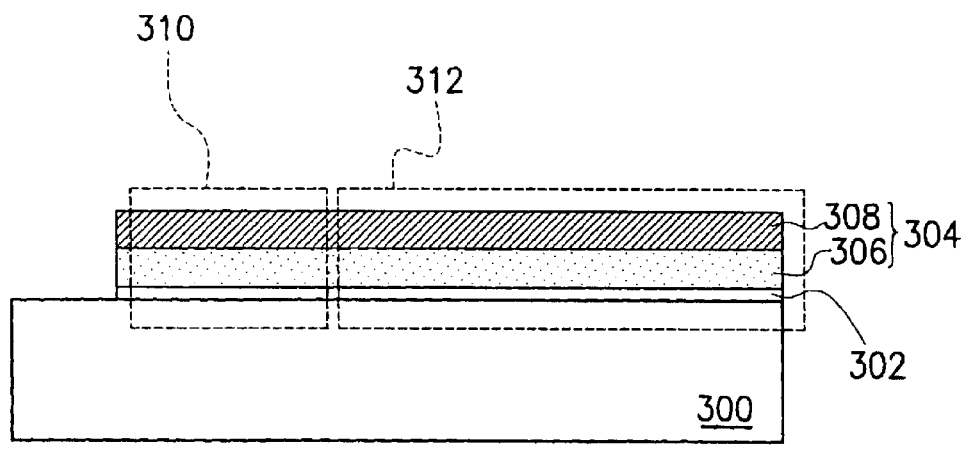
FIGS. 3A–3C illustrate a process flow of fabricating a non-volatile memory capable of preventing the antenna effect according to a second embodiment of this invention in a cross-sectional view.
Figure 3B:
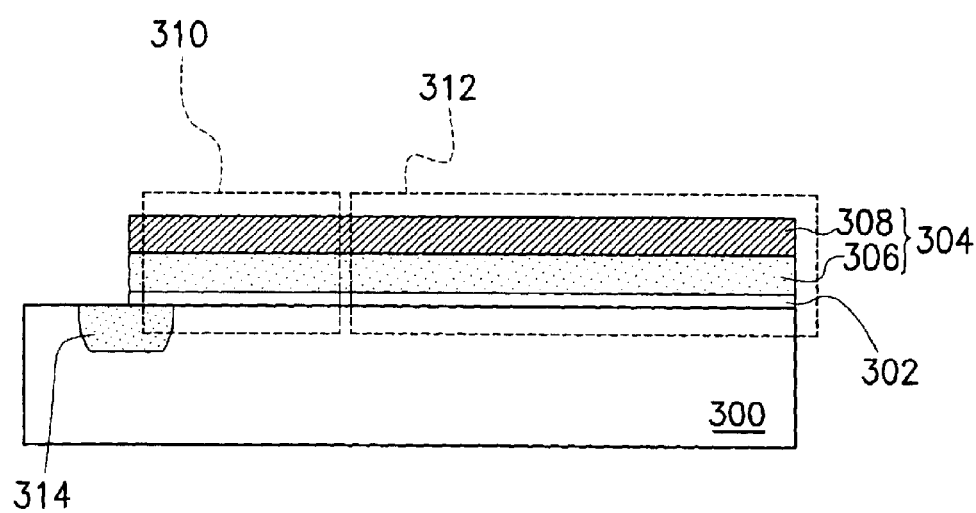
Figure 3C:
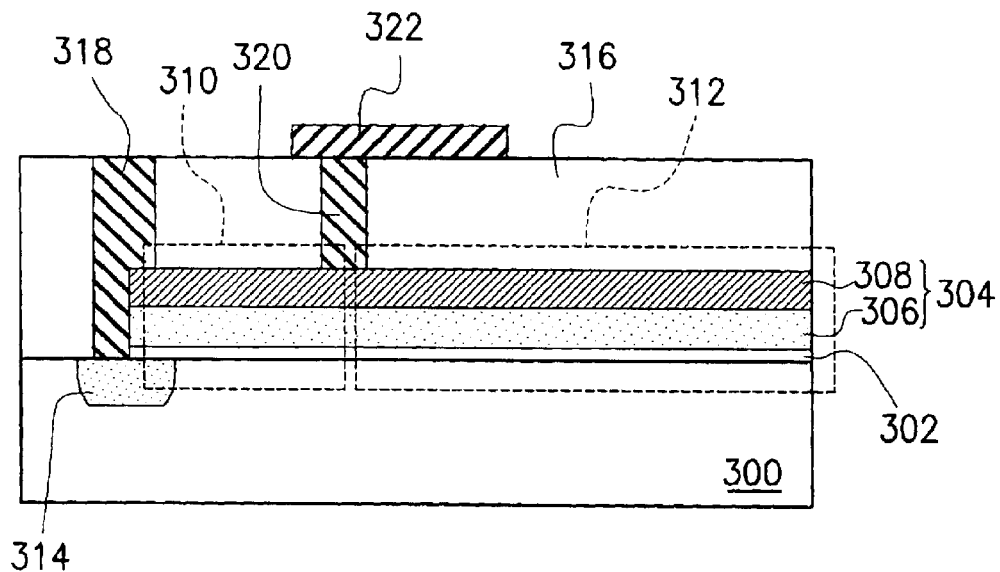

Refer to FIGS. 3A~3C, FIGS. 3A~3C illustrate a process flow of fabricating a non-volatile memory capable of preventing the antenna effect according to the second embodiment of this invention in a cross-sectional view Refer to FIG. 3A, a charge trapping layer 302, a polysilicon layer 306 and a metal silicide layer 308 are formed sequentially on a substrate 300 and then patterned to form a word-line 304 that has a high resistance portion 310 and a memory cell portion 312. The high resistance portion 310 of the word-line 304 is, for example, narrower than the memory cell portion 312 in order to have a higher resistance.

Refer to FIG. 3B, a grounding doped region 314 is formed in the substrate 300 overlapping a portion of the high resistance portion 310 of the word-line 304.

Refer to FIG. 3C, a dielectric layer 316 is formed over the substrate 300. A contact 318 is formed in the dielectric layer 316 to electrically connect the grounding doped region 314 and the high resistance portion 310 of the word-line 304. Another contact 320 is formed simultaneously in the dielectric layer 316 to electrically connect with the memory cell portion 312 of the word-line 304. Thereafter, a metal interconnect 322 is formed over the substrate 300 to electrically connect with the memory cell portion 312 of the word-line 304 via the contact 320.

Figure 4A:
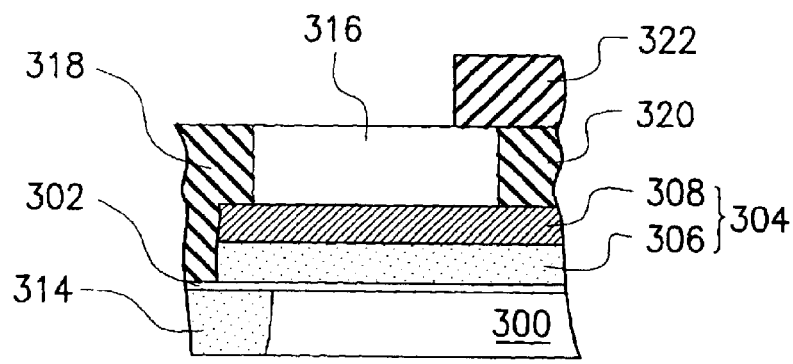
FIG. 4A and FIG. 4B illustrate a magnified cross-sectional view and a magnified top view, respectively, of the high resistance portion shown in FIG. 3C.
Figure 4B:
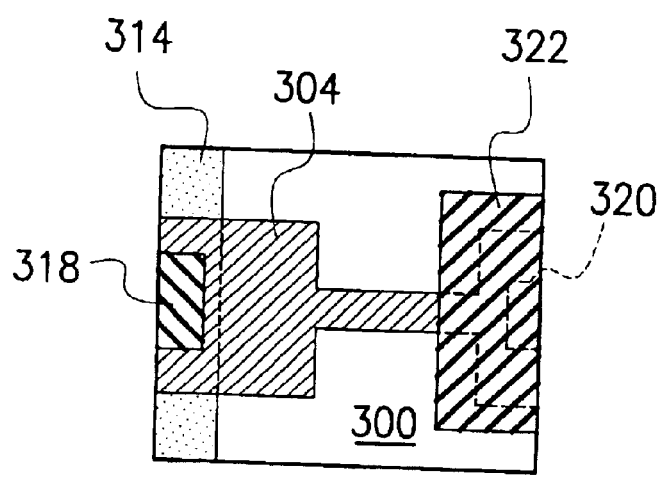

Refer to FIGS. 4A and 4B to further understand the structure of the high resistance portion 310 of the word-line 304. FIG. 4A and FIG. 4B illustrate a magnified cross-sectional view and a magnified top view, respectively, of the high resistance portion 310 shown in FIG. 3C.

As that shown in FIG. 4B, the high resistance portion 310 of the word-line 304 is narrower than the other portions of the word-line 304 to have a higher resistance. Therefore, when the manufacturing process is completed, a large current can be applied to blow the high resistance portion 310 of the word-line 304 to disconnect the memory cell portion 312 of the word-line 304 from the grounding doped region 314.

Since this invention uses a high resistance portion of the word-line to electrically connect the substrate and the word-line, the charges accumulated on the word-line can be conducted into the substrate in a plasma process. It is noted that the charges are produced in a small amount despite that the plasma environment has a relative high voltage level, so that the current formed from the charges is weak and the high resistance portion of the word-line is not blown. Therefore, the charge trapping layer of the non-volatile memory is not damaged and the memory cells are not programmed at random.

Moreover, since the high resistance portion of the word-line has a high resistance, applying a large current can easily blow the high resistance portion to disconnect the word-line from the grounding doped region when the manufacturing process is completed. Consequently, the input voltage of the memory device is not lowered and the operating speed of the memory device is not decreased.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A non-volatile memory capable of preventing an antenna effect, comprising:
    a word-line disposed on a substrate, wherein the word-line comprises a metal silicide layer and a polysilicon layer and is divided into a high resistance portion and a memory cell portion, wherein the high resistance portion is electrically connected with a grounding doped region in the substrate;
    a charge trapping layer located between the word-line and the substrate; and
    a metal interconnect electrically connecting with the memory cell portion of the word-line via a first contact.

2. The non-volatile memory of claim 1, wherein the high resistance portion of the word-line is narrower than the memory cell portion of the word-line.

3. The non-volatile memory of claim 1, wherein the high resistance portion of the word-line is electrically connected with the grounding doped region via a second contact.

4. The non-volatile memory of claim 1, wherein the charge trapping layer comprises a silicon oxide/silicon nitride/silicon oxide (ONO) composite layer.

5. The non-volatile memory of claim 1, wherein the metal silicide layer comprises tungsten silicide.

6. The non-volatile memory of claim 1, wherein the high resistance portion of the word-line is blown by a current when a manufacturing process is completed.

* * * * *